(12) United States Patent
Park

(10) Patent No.: US 12,379,848 B2
(45) Date of Patent: Aug. 5, 2025

(54) METHOD AND DEVICE WITH MEMORY PROCESSING CONTROL

(71) Applicant: SAMSUNG ELECTRONICS CO., LTD., Suwon-si (KR)

(72) Inventor: Hyun Sun Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 17/974,168

(22) Filed: Oct. 26, 2022

(65) Prior Publication Data

US 2023/0195316 A1 Jun. 22, 2023

(30) Foreign Application Priority Data

Dec. 22, 2021 (KR) .................. 10-2021-0185417

(51) Int. Cl.
*G06F 3/06* (2006.01)

(52) U.S. Cl.
CPC .......... *G06F 3/0613* (2013.01); *G06F 3/0625* (2013.01); *G06F 3/0653* (2013.01); *G06F 3/0673* (2013.01)

(58) Field of Classification Search
CPC .... G06F 3/0613; G06F 3/0625; G06F 3/0653; G06F 3/0673; G06F 11/1048;
(Continued)

(56) References Cited

U.S. PATENT DOCUMENTS 10,884,481 B2 1/2021 Nguyen et al.
10,978,134 B1 4/2021 Zheng et al.
(Continued)

FOREIGN PATENT DOCUMENTS

| EP | 3 805 936 A1 | 4/2021 |
|---|---|---|
| KR | 10-2018-0061445 A | 6/2018 |
| KR | 10-1867219 B1 | 6/2018 |
| KR | 10-1944037 B1 | 1/2019 |
| KR | 10-2021-0067505 A | 6/2021 |

OTHER PUBLICATIONS

Ke, Liu, et al. "Recnmp: Accelerating personalized recommendation with near-memory processing." *2020 ACM/IEEE 47th Annual International Symposium on Computer Architecture (ISCA)*. IEEE, 2020.

(Continued)

*Primary Examiner* — Hosain T Alam
*Assistant Examiner* — Zubair Ahmed
(74) *Attorney, Agent, or Firm* — NSIP Law

(57) ABSTRACT

A memory power control command may be received from a host and may include either a first power control command or a second power control command. The first power control command may correspond to the host not using a memory device, and the second power control command may correspond to the host using the memory device. It may be determined whether to activate a memory processor based on the memory power control command and on memory processor activation information. When the memory processor is activated based on the determining, an operation of the memory processor may be started based on the first power control command or ended based on the second power control command. When the memory processor is inactivated based on the determining, it may be determined whether to activate or inactivate the memory based on the memory power control command.

30 Claims, 10 Drawing Sheets

(58) Field of Classification Search
CPC .... G06F 1/3225; G06F 1/3275; G06F 1/3228; G06F 11/0793; G06F 11/3037; G06F 11/3055; G11C 5/148; G11C 11/4074; G11C 7/1048; Y02D 10/00
USPC .................................................. 711/154, 100
See application file for complete search history.

(56) References Cited

U.S. PATENT DOCUMENTS

| | | | |
|---|---|---|---|
| 2005/0240745 A1* | 10/2005 | Iyer | G06F 13/1668 711/E12.079 |
| 2007/0113015 A1 | 5/2007 | Moll et al. | |
| 2008/0083030 A1* | 4/2008 | Durham | G06F 8/656 726/22 |
| 2014/0149770 A1* | 5/2014 | Ahmad | G06F 1/3287 713/323 |
| 2014/0207996 A1 | 7/2014 | Fisher et al. | |
| 2017/0052738 A1* | 2/2017 | Shimmitsu | G06F 3/0647 |
| 2017/0371574 A1* | 12/2017 | Springberg | G06F 13/4068 |
| 2018/0033479 A1 | 2/2018 | Lea et al. | |
| 2018/0151250 A1 | 5/2018 | Choi et al. | |
| 2018/0210539 A1 | 7/2018 | Hashimoto | |
| 2019/0278496 A1 | 9/2019 | Rowley | |
| 2020/0034068 A1 | 1/2020 | Masubuchi | |
| 2020/0356305 A1 | 11/2020 | Kim et al. | |
| 2021/0173784 A1 | 6/2021 | Niu et al. | |

OTHER PUBLICATIONS

Huangfu, Wenqin, et al. "Medal: Scalable dimm based near data processing accelerator for dna seeding algorithm." *Proceedings of the 52nd Annual IEEE/ACM International Symposium on Microarchitecture*. Oct. 2019. pp. 587-599.

Partial European search report issued on May 23, 2023, in counterpart European Patent Application No. 22210515.7 (21 pages in English).

Extended European search report issued on Sep. 28, 2023, in counterpart European Patent Application No. 22210515.7 (20 pages).

Korean Office Action Issued on Dec. 2, 2024, in Counterpart Korean Patent Application No. 10-2021-0185417 (7 Pages in English, 10 Pages in Korean).

Extended European search report issued on Sep. 18, 2024, in counterpart European Patent Application No. 24177545.1 (8 pages).

* cited by examiner

METHOD AND DEVICE WITH MEMORY PROCESSING CONTROL

CROSS-REFERENCE TO RELATED APPLICATIONS

This application claims the benefit under 35 USC § 119(a) of Korean Patent Application No. 10-2021-0185417 filed on Dec. 22, 2021, in the Korean Intellectual Property Office, the entire disclosure of which is incorporated herein by reference for all purposes.

BACKGROUND

1. Field

The following description relates to a method and device with memory processing control.

2. Description of Related Art

A memory may be completely separated from a processor configured to perform an operation or computation with respect to the memory. A large amount of data may be transmitted and received between the memory and a processor in a system performing operations or computation on large amounts of data.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method includes receiving, from a host, a memory power control command comprising either a first power control command or a second power control command, wherein the first power control command corresponds to the host not using a memory device, and wherein the second power control command corresponds to the host using the memory device. The method includes determining whether to activate a memory processor based on the memory power control command and on memory processor activation information. When the memory processor is activated based on the determining, the method includes starting an operation of the memory processor based on the first power control command or ending the operation of the memory processor based on the second power control command. When the memory processor is inactivated based on the determining, the method includes determining whether to activate or inactivate the memory based on the memory power control command.

The first power control command may include a power-saving start command for starting a power-saving state of the memory device, or a charging start command for starting a charging state of the memory device to maintain data included in the memory.

The second power control command may include a power-saving end command for ending a power-saving state or a charging end command for ending a charging state.

The charging state may include a first charging state for compensating for an electric charge quantity attenuated after a memory reading operation or a second charging state for compensating for a leaked electric charge of a memory cell.

The determining whether to activate or inactivate the memory may include inactivating the memory based on the first power control command or activating the memory based on the second power control command.

The memory power control command may include a command valid for the memory after a predetermined time elapses from a point in time of receiving the memory power control command.

The predetermined time may include a time available for an operation without a conflict between a command of the memory processor and a command of the host.

In response to an occurrence of an error, the memory processor activation information may be updated to include information that activates the memory processor to correct the error.

In response to the occurrence of the error the memory processor may store position information on a position at which the error occurs in the memory.

The memory processor may correct the error based on the first power control command and the position information.

When the operation of the memory processor is ended based on the second power control command, the memory processor activation information may be updated based on determining whether any error remains to be processed by the memory processor.

The memory processor executes at least one command in a command buffer, and the command buffer includes at least one command received from the host.

The operation of the memory processor may be ended based on the second power control command, and the memory processor activation information may be updated based on whether a command is determined to be present in the command buffer.

The memory device further includes a decoder, the determining whether to activate the memory processor is performed by the decoder, and the inactivating of the memory processor is caused by the decoder.

The method may further include the host generating the first power control command when the host determines to not use the memory device, and generating the second power control command when the host determines to use the memory device.

In one general aspect, a device includes a memory device comprising a memory and a memory processor. The memory device determines whether to activate the memory processor based on a received memory power control command and memory processor activation information. The memory power control command is either a first power control command corresponding to a host not using the memory or a second power control command corresponding to the host using the memory. When the memory processor is activated based on the memory power control command and the memory processor activation information, either operation of the memory processor starts based on the first power control command or operation of the memory processor ends based on the second power control command. When the memory processor is inactivated based on the memory power control command and the memory processor activation information, the device memory determines whether to activate or inactivate the memory based on the memory power control command.

The first power control command may include either a power-saving start command for starting a power-saving state or a charging start command for starting a charging state to maintain data included in the memory.

The second power control command may include either a power-saving end command for ending a power-saving state or a charging end command for ending a charging state.

The charging state may include either a first charging state for compensating for an electric charge quantity attenuated after a memory reading operation or a second charging state for compensating for a leaked electric charge quantity of a memory cell.

The memory device may inactivate the memory based on the first power control command or activates the memory based on the second power control command.

The memory power control command may only be treated by the memory device as valid for the memory after a predetermined time elapses from a point in time of the memory device receiving the memory power control command.

The predetermined time includes a time during which a command of the memory processor will not conflict with a command of the host.

In response to an occurrence of an error, the memory processor activation information is updated to information that activates the memory processor to correct the error.

The memory processor responds to the occurrence of the error by storing position information on a position at which the error occurs in the memory.

The memory processor corrects the error based on the first power control command and the position information.

When the operation of the memory processor is ended based on the second power control command, the memory processor activation information is updated based on whether any error remains to be processed by the memory processor.

The memory processor is configured to execute at least one command in a command buffer that provides commands to the memory processor, and the command buffer includes at least one command received from the host.

When the operation of the memory processor is ended based on the second power control command, the memory processor activation information is updated based on whether a command is present in the command buffer.

The device is an electronic device that further includes the host, and the host includes a host processor configured to provide the power control command to the memory device.

The memory device is a neural processing unit.

The memory device may be a near-memory-processing (NMP) memory device.

In a general aspect, a method controls a memory device having a memory and a memory processor. The method includes maintaining an activation flag indicating an activation state of the memory processor, wherein the processor is configured to operate on the memory and is configured to execute commands received from a host. The method further includes controlling the memory and the processor according to the flag, wherein the flag indicates whether the processor is active or not. The controlling includes, responsive to receiving, by the memory device, a first command from the host: when the flag indicates that the activation state of the memory processor is in an active state: starting execution of the processor, and when flag indicates that the activation state of the memory processor is in an inactive state: deactivating the memory. Responsive to receiving from the host, by the memory device, a second command that is received after the first command: when the flag indicates that the activation state of the processor is in the active state: stopping execution of the processor, and when the flag indicates that the activation state of the processor is in the inactive state: activating the memory.

The method may further include executing, by the memory device, the first command, the executing the first command comprising starting a low-power mode of the memory device, and executing, by the memory device, the second command, the executing the second command comprising exiting the low-power mode of the memory device.

The memory device may further include a decoder, and the activating the memory and the deactivating the memory may include exiting the low-power mode of the memory device.

The controlling according to the flag may prevent the memory processor and the host from using the memory of the memory device at the same time.

The responding to receiving the first command may further include: when the flag indicates that the activation state of the memory processor is in the active state: not deactivating the memory, and when flag indicates that the activation state of the memory processor is in the inactive state: not starting execution of the processor, and the responding to receiving the second command may further include: when the flag indicates that the activation state of the memory processor is in the active state: not activating the memory, and when the flag indicates that the activation state of the memory processor is in the inactive state: not stopping execution of the processor.

A host connected with the memory device may generate the first command.

Other features and aspects will be apparent from the following detailed description, the drawings, and the claims.

Figure 1:
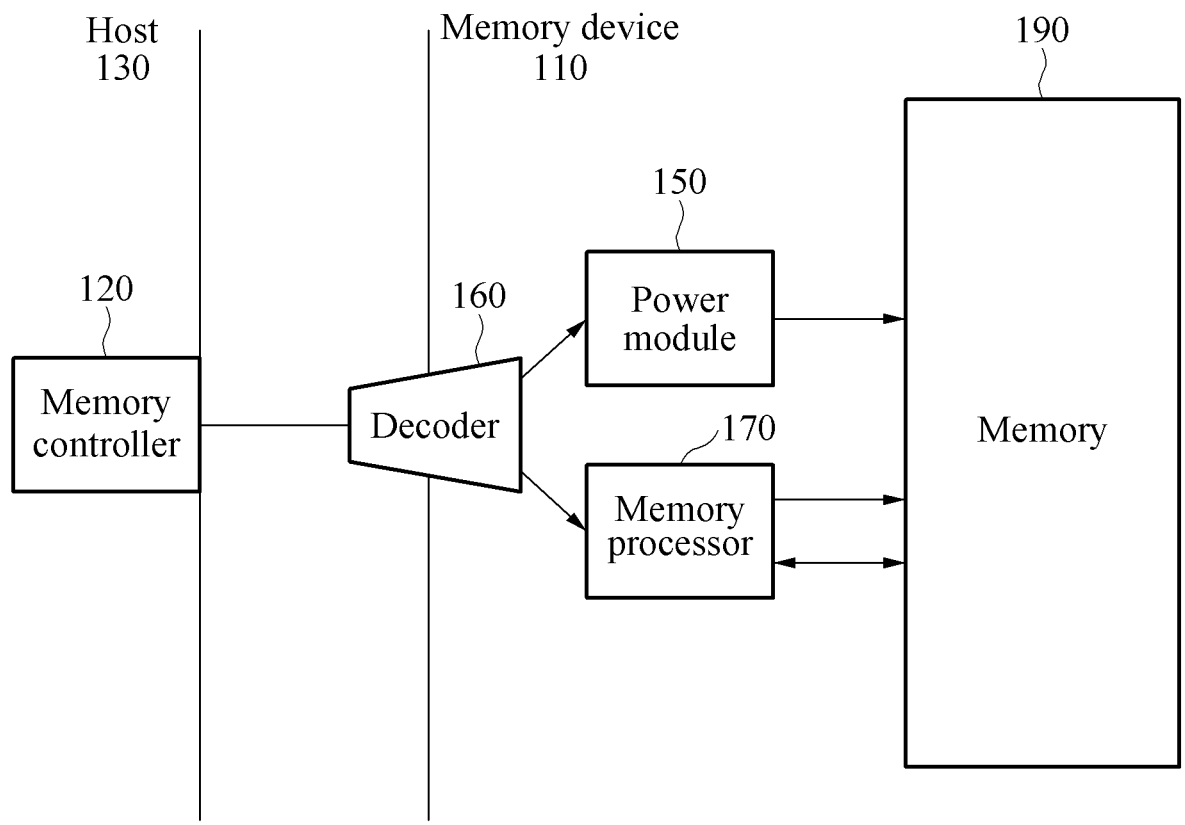
FIG. 1 illustrates an example of a memory device for controlling a memory processor using a memory power control command, according to one or more embodiments.

Throughout the drawings and the detailed description, unless otherwise described or provided, the same drawing reference numerals may be understood to refer to the same or like elements, features, and structures, or non-limiting examples thereof. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

Also, in the description of example embodiments, detailed description of structures or functions that are thereby known after an understanding of the disclosure of the present application will be omitted when it is deemed that such description will cause ambiguous interpretation of the example embodiments.

According to an example embodiment, a processor may execute, for example, computer-readable instructions (e.g., code or a program), to control one or more other components (e.g., hardware components or hardware plus computer-readable instructions) of an electronic device with, or connected to, the processor and perform various types of data processing and computation. As at least a portion of the data processing or computation, the processor may store instructions or data received from another component in a volatile memory, process the instructions or data stored in the volatile memory, and store resultant data in a nonvolatile memory. The processor may include a main processor (e.g., a central processing unit (CPU) or an application processor of the electronic device) or an auxiliary processor (e.g., a graphics processing unit (GPU), a neural processing unit (NPU), an image signal processor, a sensor hub processor, or a communication processor) operable independently of or along with the main processor. For example, when the electronic device includes both the main processor and the auxiliary processor, the auxiliary processor may use lower power than the main processor or may be set to be specific to an assigned function. The auxiliary processor may be implemented separately from or as a portion of the main processor. As a non-limiting example, an NPU of the electronic device may be, or include, a processor-in-memory (PIM) device that includes memory and a memory processor.

A large amount of data may be transmitted and received between such an example memory device and a processor in a system, according to various embodiments, performing operations or computation on large amounts of data, for example, in example training and/or inference implementations of neural networks, big data analyses, and of Internet of things (IoT) devices, with reduction of bottlenecks. To reduce bottlenecks, processing-in-memory (PIM) examples where a memory device may be provided with memory for storing data combined with processor(s) for performing operations or computation within the memory device may be provided, as well as examples where the processor is separate from memory.

FIG. 1 illustrates an example of a memory device for controlling a memory processor using a memory power control command. A memory device 110 may communicate with a host 130 and may include a memory controller 120, a decoder 160, a power module 150, a memory processor 170, and a memory 190. In an example, the memory device 110 may be a device configured to temporarily or permanently store therein data for a computer such as the host 130. The memory device 110 may include a device configured to transmit or receive data at the request of the host 130. The memory device 110 may further include other components, or some of the components may be omitted from the memory device 110.

An example of the memory processor 170 may include a processor configured to perform an operation (or computation) in the memory device 110. The memory processor 170 may perform at least a portion of a plurality of operations that may also be capable of being performed by a central processing unit (CPU). For example, the memory processor 170 may include a near-memory processor (NMP) present outside a memory chip and/or an in-chip processor, i.e., a processor inside the memory chip, an example PIM memory device. An example electronic device may include one or more of the NMP devices and/or one or more of the PIM devices.

An example of the decoder 160 may include a module configured to receive a command from the host 130 and to transmit a corresponding signal to the memory processor 170. For example, the decoder 160 may receive a memory power control command from the host 130. The decoder 160 may determine whether to activate the memory processor 170 based on memory processor activation information stored in a portion of the memory 190. The decoder 160 may transmit an operation-start signal and/or an operation-end signal to the memory processor 170 based on the memory processor activation information. The decoder 160 may transmit a memory power control signal to the power module 150 based on the power control command received from the host 130.

Some examples of the memory 190 may include a memory unit, i.e., as a memory portion of the memory 190. The memory unit may be a set of one or more memory chips. The memory unit may include a memory rank, a memory bank, a dual in-line memory module (DIMM), and/or a single in-line memory module (SIMM). A memory rank may be one block or area generated using a portion or all of the memory chips of a single memory module. For example, one rank may correspond to a data block of a 64-bit range. In this example, when one chip corresponds to 8 bits, 8 chips may be included. When one chip corresponds to 4 bits, 16 chips may be included. A plurality of ranks may be present in one DIMM. A memory bank may correspond to a host memory slot. A memory bank may also be a set of memory chips connected to the same control line for simultaneous access. A DIMM may be a memory module in which a plurality of dynamic random-access memory (DRAM) chips is provided on a circuit board and may be used as a main memory of a computer. A DIMM may include a plurality of ranks.

The memory 190 may include a combination of a static RAM (SRAM), a DRAM, and/or a synchronous DRAM (SDRAM). The memory 190 may include a DRAM such as, for example, a double data rate (DDR) SDRAM (DDR SDRAM), a low-power DDR 5 (LPDDR5), a graphics DDR (GDDR) SDRAM (GDDR SDRAM), a Rambus DRAM (RDRAM), and the like.

The memory processor activation information may include information indicating or controlling whether to activate the memory processor 170. For example, the decoder 160 may determine whether to activate the memory processor 170 based on the memory processor activation information. For example, the decoder 160 may determine that a signal is to be transmitted to the memory processor 170 based on the memory power control command by reading the memory processor activation information. The decoder 160 may, in advance, store the information on whether to activate the memory processor 170 in an area of the memory 190. Alternatively, the host 130 may, in advance, store the information on whether to activate the memory processor 170 in an area of the memory 190. The memory processor activation information may be stored in locations other than an area of the memory 190.

An example of the power module 150 may include a module configured to control power of the memory 190. For example, the power module 150 may include a module configured to control power to be supplied to the memory 190. The power module 150 may control power to be supplied to the memory 190 based on the power control command. For example, when a charging-start command is received, the power module 150 may supply to the memory 190 power for charging the memory 190.

The host 130 may include a main processor (e.g., a CPU or an application processor). The main processor may execute instructions to control one or more other components of an electronic device connected with the main processor and process various sets of data or to perform an operation (or computation).

The memory controller 120 may control the memory device 110, at the request of the host 130, to write or read data. The memory controller 120 may also control operations of the memory device 110 by applying commands for controlling the memory device 110.

The memory device 110 may receive the memory power control command from the host 130. The memory power control command may include a command for controlling power to be supplied to a memory. For example, the memory power control command may include a power-saving command and/or a charging command. The power-saving command may include a command for controlling power consumption of a memory. For example, the power-saving command may include a power down mode entry (hereinafter, PDE) command and/or a power down mode exit (hereinafter, PDX) command. The PDE command may include a command for starting a power-saving mode of a memory, and the PDX command may include a command for ending the power-saving mode of the memory. The power-saving command may be used to block an interface between the memory device 110 (and a component or connection outside thereof) which may inhibit a constant current in an input buffer and thereby reduce power consumption. In addition, the memory device 110 may short-circuit a portion of power supply devices that is unnecessary in an internal circuit and reduce an internal constant current in a memory to thereby reduce power consumption. The charging command may include a command for charging or filling a consumed electric charge quantity in a memory. For example, the charging command may include a refresh (hereinafter, REF) command, a self-refresh entry (hereinafter, SRE) command, a self-refresh exit (hereinafter, SRX) command, a precharge (hereinafter, PRE) command, a precharge all (hereinafter, PREA) command, an auto-refresh command, and the like. The REF command may include a command for refreshing or recharging a memory on a periodic basis to compensate for electric charges used in a memory cell. The REF command may include, for example, a self-refresh (SRX or SRE) command and/or an auto-refresh command. The self-refresh command may include a command applied by the memory device 110 itself. The auto-refresh command may include a command applied by the host 130 to the memory device 110. The PRE command may include a command for compensating for an electric charge quantity attenuated after a memory reading operation.

The memory power control command may be, for example, a first power control command (which is a command when the host 130 does not use the memory 190) or a second power control command (which is a command when the host 130 uses the memory 190).

An example of the first power control command may include a command for controlling the memory 190 by the memory device 110 during a time when the host 130 does not use the memory 190. The first power control command may include a power-saving start command for starting the power-saving state or a charging start command for starting the charging state. For example, when the host 130 does not use the memory 190, the memory 190 may enter the power-saving state to save power consumed by the memory 190. For another example, when the host 130 does not use the memory 190, the memory 190 may enter the charging state to maintain data stored therein and to compensate for an electric charge quantity attenuated in a memory cell. When the memory 190 is in the power-saving state or the charging state, the host 130 may not access the memory 190 to read or write data. That is, when the first power control command is transmitted to the memory device 110, the host 130 may not access the memory 190. For example, when the memory 190 is in the power-saving state or the charging state, the memory device 110 may not accept a command of the host 130 as a valid command and may not execute the command, even though the command of the host 130 is applied to the memory device 110. In some examples, it may be only particular commands that are not accepted, e.g., read and write commands, and in other examples it may be only particular commands that are accepted, e.g., a second power control command. Another example of the first power control command may include a command for allowing the memory processor 170 to access the memory 190. For example, the first power control command may be a command that disallows the host 130 from accessing the memory 190 while at the same time allowing the memory processor 170 to access the memory 190 for a predetermined period of time. That is, some examples of the first power control command may prevent a conflict between the host 130 and the memory processor 170.

The power-saving start command may include the PDE command mentioned above for entering the power-saving state of a memory. The charging start command may include the SRE command, the REF command, and/or the PRE command for entering the charging state of a memory.

An example of the second power control command may include a command for the host 130 to use the memory 190. When the host 130 is to use the memory 190, the second power control command may include a command to be transmitted to the memory device 110. For example, when the memory 190 is in the power-saving state and/or the charging state, the host 130 may not use the memory 190. Thus, to allow the host 130 to perform an operation using the memory 190, the power-saving state and/or the charging state of the memory 190 may need to be ended. In this case, the host 130 may transmit the second power control command to the memory device 110 to end this state. When the host 130 applies the second power control command to the memory device 110, after a predetermined period of time elapses, the host 130 may then apply a valid command (in particular a read or write) to the memory device 110. For the period of time, the memory processor 170 may perform an operation using the memory 190.

The second power control command may include a power-saving end command for ending the power-saving state or it may include a charging end command for ending the charging state to maintain data included in the memory 190. The power-saving end command may include a PDX command for ending the power-saving state of a memory. The charging end command may include an SRX command for ending the charging state of a memory.

The charging state may include a refresh state and/or a precharge state of a memory. The charging state may include (i) a first charging state for compensating for an electric charge quantity attenuated after a memory reading operation or (ii) a second charging state for compensating for a leaked electric charge quantity of a memory cell. The first charging state may include a state for compensating for an electric charge quantity attenuated after the memory reading operation. The first charging state may include a state in which an activated memory unit (or a column included in the memory unit) is inactivated. For example, the first charging state may include a precharge state. The second charging state may include a periodic recharging state for compensating for an electric charge quantity consumed gradually by a leakage when electric charges are filled in a capacitor in a memory cell. The recharging (or refreshing) may be performed when a memory is inactivated. The second charging state may include a refresh state.

An example of the memory device 110 may determine whether to activate the memory processor 170 included in the memory device 110 based on the memory power control command and the memory processor activation information. Activating a memory processor will be further described with reference to FIGS. 2A and 2B.

In some embodiments, the host 130 may control the memory processor 170 using the same memory power control command that may be used to control a memory device that does not have (or use) a memory processor 170 for controlling the memory device 110. In addition, various commands applied by the host 130 to the memory device 110 may be invalidated (disregarded, etc.) by the memory device 110 during a time for which the memory processor 170 performs an operation, and thus conflict between the host 130 and the memory processor 170 may be minimized or avoided. By applying previously used power control commands (commands corresponding to a previous memory device design) to the memory device 110, the host 130, using the same previous commands, may control the memory processor 170 with a minimum cost and with compatibility between the host 130 and a prior memory device as well as between the host 130 and the memory processor 170.

Figure 2A:
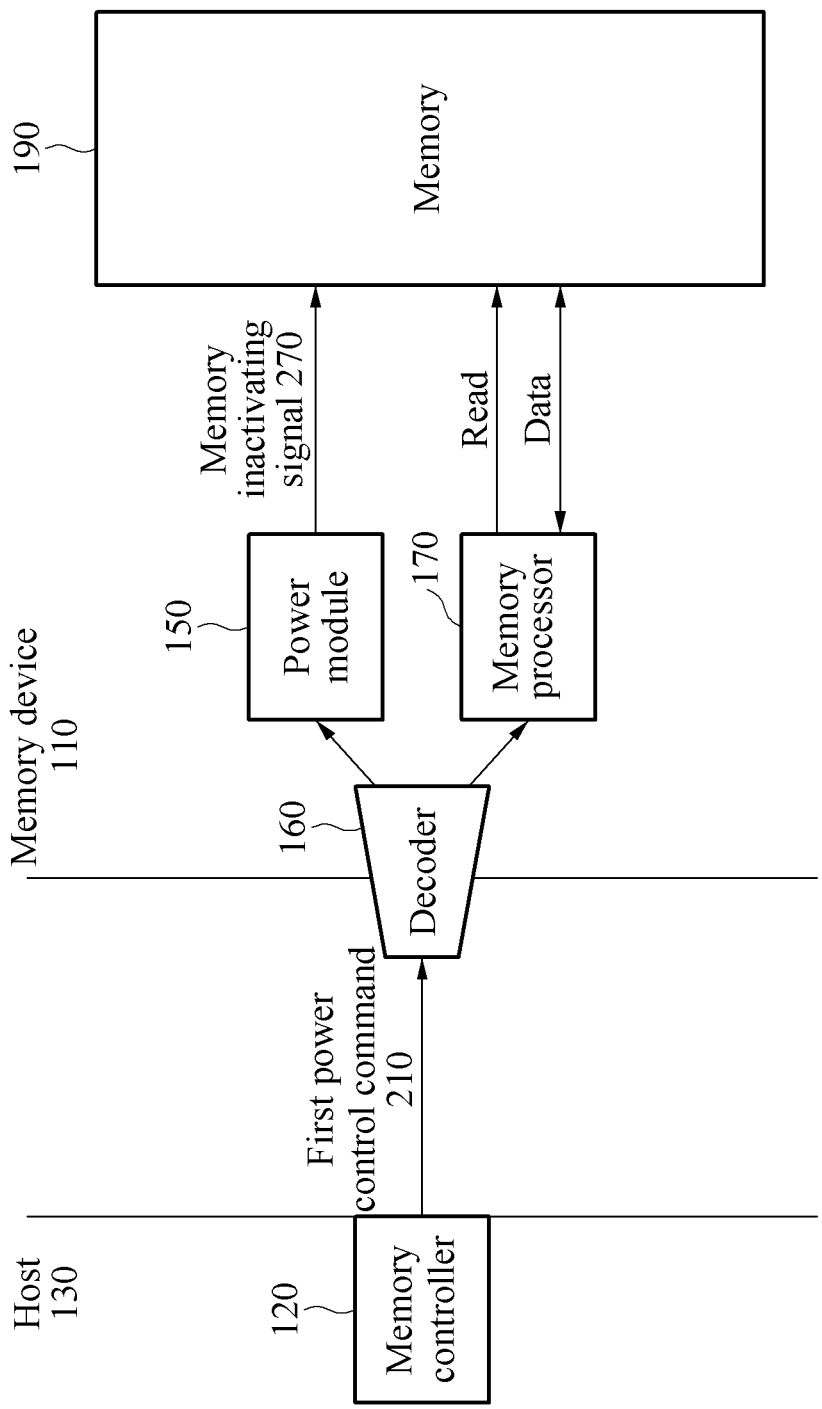
FIG. 2A illustrates an example of a state of a memory processor and a memory based on a first power control command, according to one or more embodiments.
Figure 2B:
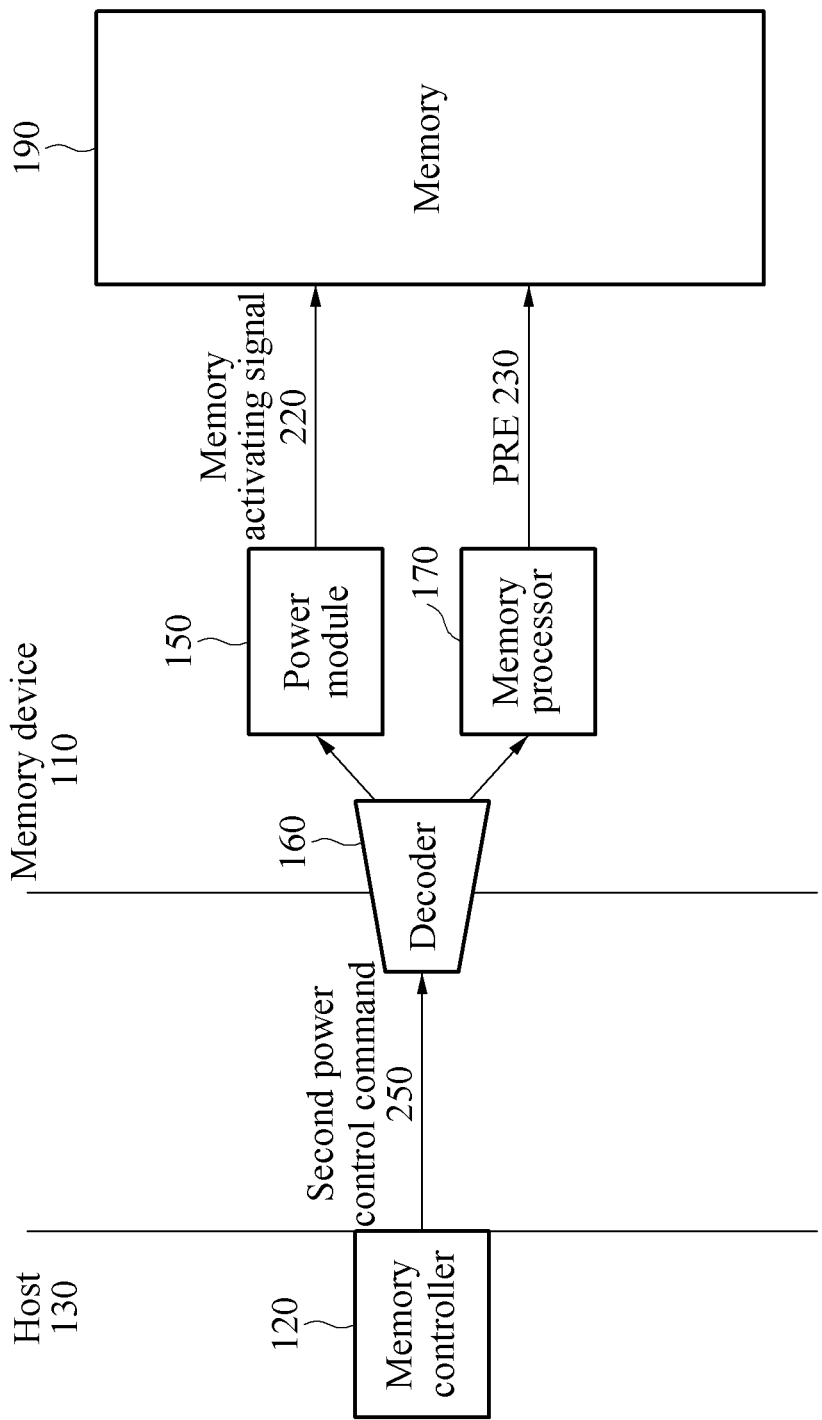
FIG. 2B illustrates an example of a state of a memory processor and a memory based on a second power control command, according to one or more embodiments.

FIGS. 2A and 2B illustrate an example of an operation of a memory processor based on a first power control command and an example of an operation of the memory processor based on a second power control command. As non-limiting examples, the A signal transmitted from the decoder 160 to the memory processor 170 is not limited to one specific type but may be denoted as various types herein. For example, the signal applied from the decoder 160 to the memory processor 170 may include a signal representing a start of an operation of the memory processor 170 (which indicates activation of the memory processor 170) and/or an end of the operation of the memory processor 170 (which indicates inactivation of the memory processor 170).

FIG. 2A illustrates an example of a state of the memory processor 170 and the memory 190 based on a first power control command, according to one or more embodiments. The memory controller 120 may transmit a first power control command 210 to the decoder 160. The decoder 160 may determine whether to activate the memory processor 170 based on the first power control command 210 and, in some examples may determine to inactivate the memory processor 170, based also on memory processor activation information.

In some implementations, there may be a case in which the memory processor 170 is to be activated. For example, when the memory processor activation information includes information indicating 'memory processor activation,' the decoder 160 may activate the memory processor 170. In this example, when the memory processor activation information corresponds to 'memory processor activation,' the decoder 160 may start or end an operation of the memory processor 170 based on a type of a memory power control command. For example, some tasks e.g., executing a command, correcting an error, etc., can be processed by the memory processor 170, and the memory processor 170 may be activated for such tasks when the memory processor activation information indicates 'memory processor activation' or otherwise indicates that the memory processor 170 is available to be activated.

When the decoder 160 receives the first power control command 210, the decoder 160 may transmit a memory processor activating signal to the memory processor 170. In this case, the memory processor 170 may start an operation. The memory processor 170 may access data stored in the memory 190 while performing whichever task has been assigned to the memory processor 170. For example, the memory processor 170 may read data present at a specific position in the memory 190 and receive the data from the memory 190.

There may be a case in which the memory processor 170 is to be inactivated. For example, when the memory processor activation information includes information indicating 'memory processor inactivation,' the decoder 160 may inactivate the memory processor 170. Note that 'memory processor inactivation' does not override the command; if the command is the second power control command, the decoder may not send any signals to memory processor 170. The decoder 160 may transmit a memory processor inactivating signal to the memory processor 170. When the memory processor 170 is inactivated, the decoder 160 may transmit the first power control command 210 and/or a memory inactivating signal 270 to the power module 150 and/or to the memory 190. For example, the decoder 160 may transmit the first power control command 210 to the power module 150. The power module 150 may transmit the memory inactivating signal 270 to the memory 190. When the memory processor 170 is inactivated, the memory processor 170 may not need to access the memory 190. Thus, the memory processor 170 may not access the memory 190 to perform a task, and thus the decoder 160 may allow the memory 190 to enter a power-saving state through the first power control command 210 to reduce power used by the memory 190. For another example, the decoder 160 may allow the memory 190 to enter a charging state through the first power control command 210.

FIG. 2B illustrates an example of a state of the memory processor 170 and the memory 190 based on a second power control command, according to one or more embodiments. The memory controller 120 may transmit a second power control command 250 to the decoder 160. The decoder 160 may determine whether to activate the memory processor 170 based on the second power control command 250 and, in some cases, based also on memory processor activation information.

In an example, there may be a case in which the memory processor 170 is to be activated. For example, when the memory processor activation information includes information indicating 'memory processor activation,' the decoder 160 may activate the memory processor 170. In this example, when the memory processor activation information corresponds to 'memory processor activation,' the decoder 160 may start or end an operation of the memory processor 170 based on a type of a memory power control command received by the decoder 160. For example, when there is a task (e.g., executing a command, correcting an error, etc.) to be processed by the memory processor 170, the memory processor activation information may include the information indicating 'memory processor activation.'

When receiving the second power control command 250, the decoder 160 may transmit, to the memory processor 170, an operation-end signal for ending an operation of the memory processor 170, and the memory processor 170 may end the operation. The memory processor 170 may end performing a task assigned to the memory processor 170. For example, when receiving the operation-end signal, the memory processor 170 may transmit, to the memory 190, a charging command (e.g., a PRE command) to compensate for electric charge lost in a memory cell by the operation. When a task to be processed by the memory processor 170 is exited (e.g., suspended), the memory device 110 may additionally store information on the suspended task. Such a case in which a task to be processed by the memory processor 170 is left will be described in detail with reference to FIGS. 6 and 7.

In an example, there may be a case in which the memory processor 170 is to be inactivated. For example, when the memory processor activation information includes information indicating 'memory processor inactivation,' the decoder 160 may inactivate the memory processor 170. The decoder 160 may transmit a memory processor inactivating signal to the memory processor 170. In another example, the decoder 160 may, instead of transmitting a signal to the memory processor 170, transmit the second power control command 250 to the power module 150 and/or to the memory 190. The second power control command 250 may include a command for the host 130 to use the memory 190. Thus, when a state of the memory 190 is in a power-saving state and/or a charging state, the state may need to be ended for the host 130 to use the memory 190. The decoder 160 may transmit the second power control command 250 and a memory activating signal 220 to the power module 150 and/or the memory 190. For example, the decoder 160 may transmit the second power control command 250 to the power module 150. The power module 150 may transmit the memory activating signal 220 to the memory 190.

Figure 3A:
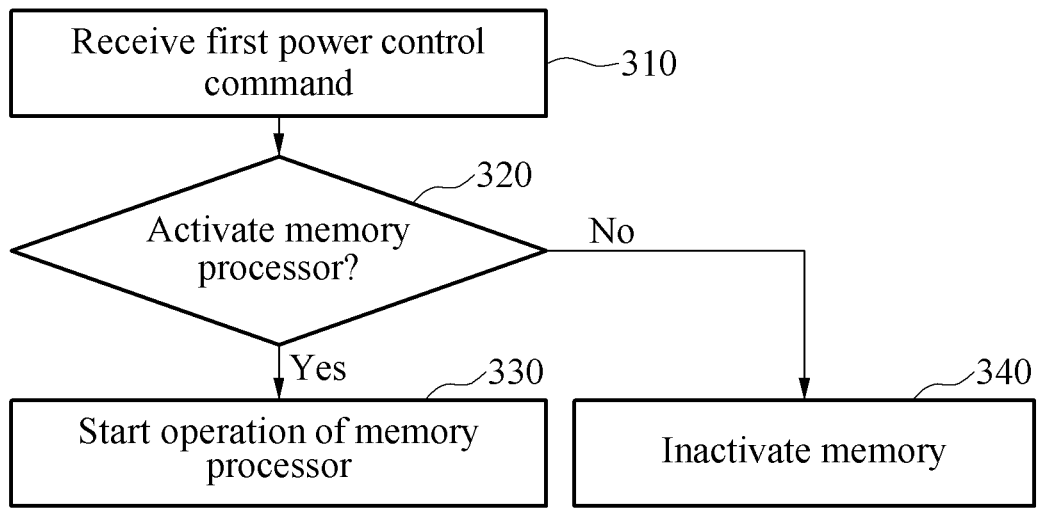
FIG. 3A illustrates an example of an operation of a memory processor based on a first power control command and on whether to activate the memory processor, according to one or more embodiments.

FIG. 3A illustrates an example of an operation of a memory processor based on a first power control command and on whether to activate the memory processor, according to one or more embodiments.

In this example, in operation 310, the decoder 160 may receive a first power control command. In operation 320, the decoder 160 may determine whether to activate the memory processor 170 based on memory processor activation information. For example, when the memory processor activation information includes information indicating 'memory processor activation,' the decoder 160 may transmit, to the memory processor 170, an operation-start signal for starting an operation of the memory processor 170 (here, the decoder operation may be considered to be a particular operation because it may change the meaning of the power control command received from the host). In this example, the decoder 160 may not transmit a control signal to the memory 190 and/or the power module 150. In operation 330, when receiving the operation start signal, the memory processor 170 may start the operation.

In operation 340, when the memory processor activation information includes information indicating 'memory processor inactivation,' the decoder 160 may transmit a memory inactivating signal to the memory 190. For example, when the memory processor activation information includes the information indicating 'memory processor inactivation,' the decoder 160 may not transmit a signal to the memory processor 170. The first power control command may include, for example, a PDE command and/or an SRE command. The decoder 160 may inactivate the memory 190 by receiving the command. In an example, 'memory inactivation' described herein may include a closed state of a memory. For example, 'memory inactivation' may include a state in which all memory units are closed. For another example, in a memory inactivation state, there may be no data bursts in progress.

Figure 3B:
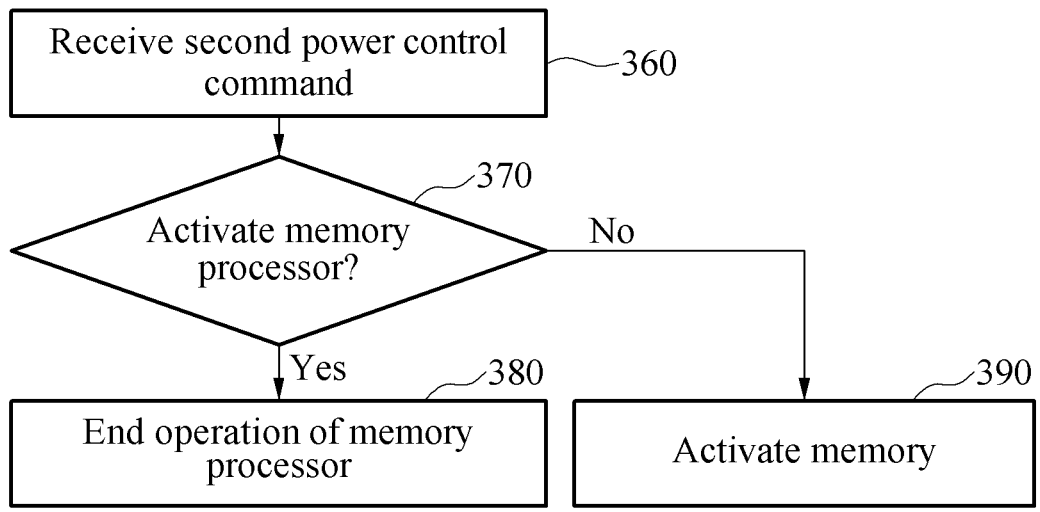
FIG. 3B illustrates an example of an operation of a memory processor based on a second power control command and on whether to activate the memory processor, according to one or more embodiments.

FIG. 3B illustrates an example of an operation of a memory processor based on a second power control command and on whether to activate the memory processor, according to one or more embodiments. In this example, in operation 360, the decoder 160 may receive a second power control command. In operation 370, the decoder 160 may determine whether to activate the memory processor 170 based on memory processor activation information. For example, when the memory processor activation information includes information indicating 'memory processor activation,' the decoder 160 may transmit, to the memory processor 170, an operation-end signal for ending an operation of the memory processor 170. In this example, the decoder 160 may not transmit a control signal to the memory 190 and/or to the power module 150. In operation 380, when receiving the operation-end signal, the memory processor 170 may end the operation.

In operation 390, when the memory processor activation information includes information indicating 'memory processor inactivation,' the decoder 160 may transmit a memory activating signal to the memory 190 and the decoder 160 may not transmit a signal to the memory processor 170. The second power control command may include, for example, a PDX command and/or an SRX command, which may cause he decoder 160 to activate the memory 190. In an example, 'memory activation' described herein may include a state in which a specific memory unit is opened or activated for memory access. For example, 'memory activation' may include a state in which a corresponding memory unit (e.g., a column or cell included in the memory unit) is activated until there a precharge command is given to the memory unit.

Figure 4:
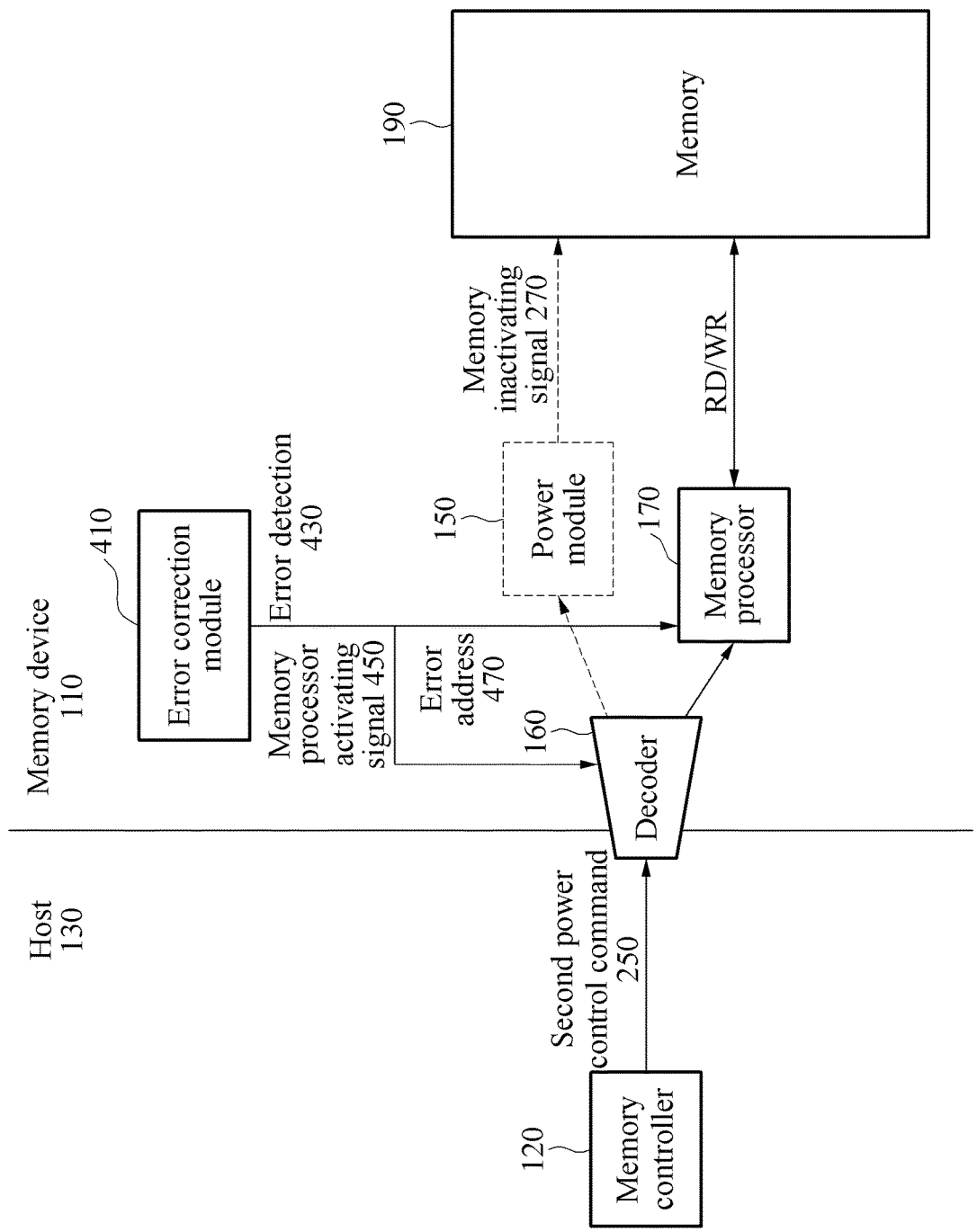
FIG. 4 illustrates an example of an operation of a memory device in response to an occurrence of an error, according to one or more embodiments.

FIG. 4 illustrates an example of an operation of a memory device in response to an occurrence of an error, according to one or more embodiments. The example memory device 110 shown in FIG. 4 may include the memory controller 120, an error correction module 410, a memory processor activating signal 450, an error address 470, the decoder 160, the memory processor 170, the power module 150, and the memory 190.

An error may occur in the memory 190, for example, when data that is not stored is invoked and/or when data different from requested data is stored in a memory. In an example, the error correction module 410 may include a module configured to detect an error occurring in the memory 190 and correct the error. The error correction module 410 may be included in the memory device 110 and/or the host 130. The error correction module 410 may include, for example, an error correction code (ECC) module.

When the error occurs in the memory 190, the error correction module 410 may detect the error in operation 430. The error correction module 410 may transmit the memory processor activating signal 450 to the decoder 160 to correct the error. The decoder 160 may receive the memory processor activating signal 450 from the error correction module 410. In an example, when receiving a second power control command 250 from the host, the decoder 160 may transmit, to the memory processor 170, an operation-end signal for ending an operation of the memory processor 170. In another example, when receiving a first power control command (also from the host), the decoder 160 may transmit, to the memory processor 170, an operation-start signal for starting an operation of the memory processor 170. The decoder 160 may receive information that activates the memory processor 170 from the error correction module 410 and may update the memory processor activation information to indicate 'memory processor activation.' However, when previous data included in the memory processor activation information indicates 'memory processor activation, the decoder 160 may maintain the data rather than update it.

In an example, the memory processor 170 may store position information indicating a position at which the error occurs in the memory 190. The position information may a position at which specific data is stored in the memory 190. For example, the position information of the error may include an address at which the error occurs. The error correction module 410 may transmit this error address 470 to the memory processor 170. The memory processor 170 may receive and store the error address 470.

An example of when an error occurs may involve the decoder 160 receiving a first power control command (e.g., 210) from the host 130 (note that the error and the power control command are not related; the error correction module controls activation information when the error occurred, and by doing this operation, the decoder will make appropriate signals based on the activation information for correcting errors). When the error occurs, the memory processor activation information may indicate 'memory processor activation' for the memory processor 170 to correct the error. The decoder 160 may receive the first power control command 210 and transmit, to the memory processor 170, an operation-start signal for starting an operation of the memory processor 170. For example, the decoder 160 may receive the first power control command 210 and transmit an error correcting operation start signal to the memory processor 170. When receiving the operation start signal (or the error correcting operation start signal), the memory processor 170 may correct the error based on the error address 470.

If multiple errors are possible, the memory processor 170 may include multiple error addresses corresponding to the errors.

In an example, the decoder 160 may receive the second power control command 250 and transmit an operation-end signal (or an error correcting operation-end signal) to the memory processor 170. In this example, the memory processor 170 may verify or determine whether there is still an error to be corrected. When there is still an error to be corrected, the memory processor activation information may be maintained as before, i.e., indicating 'memory processor activation.' This is because at least one error is still left to be corrected by the memory processor 170 and the memory processor 170 may thus still need to remain activated (i.e., may be prevented from being deactivated) when a next first power control command is received by the decoder 160. However, when no error is left to be corrected, the memory processor activation information may be updated to indicate 'memory processor inactivation.' This is because no error is left to be corrected by the memory processor 170 and the memory processor 170 may thus not need to be activated.

Figure 5:
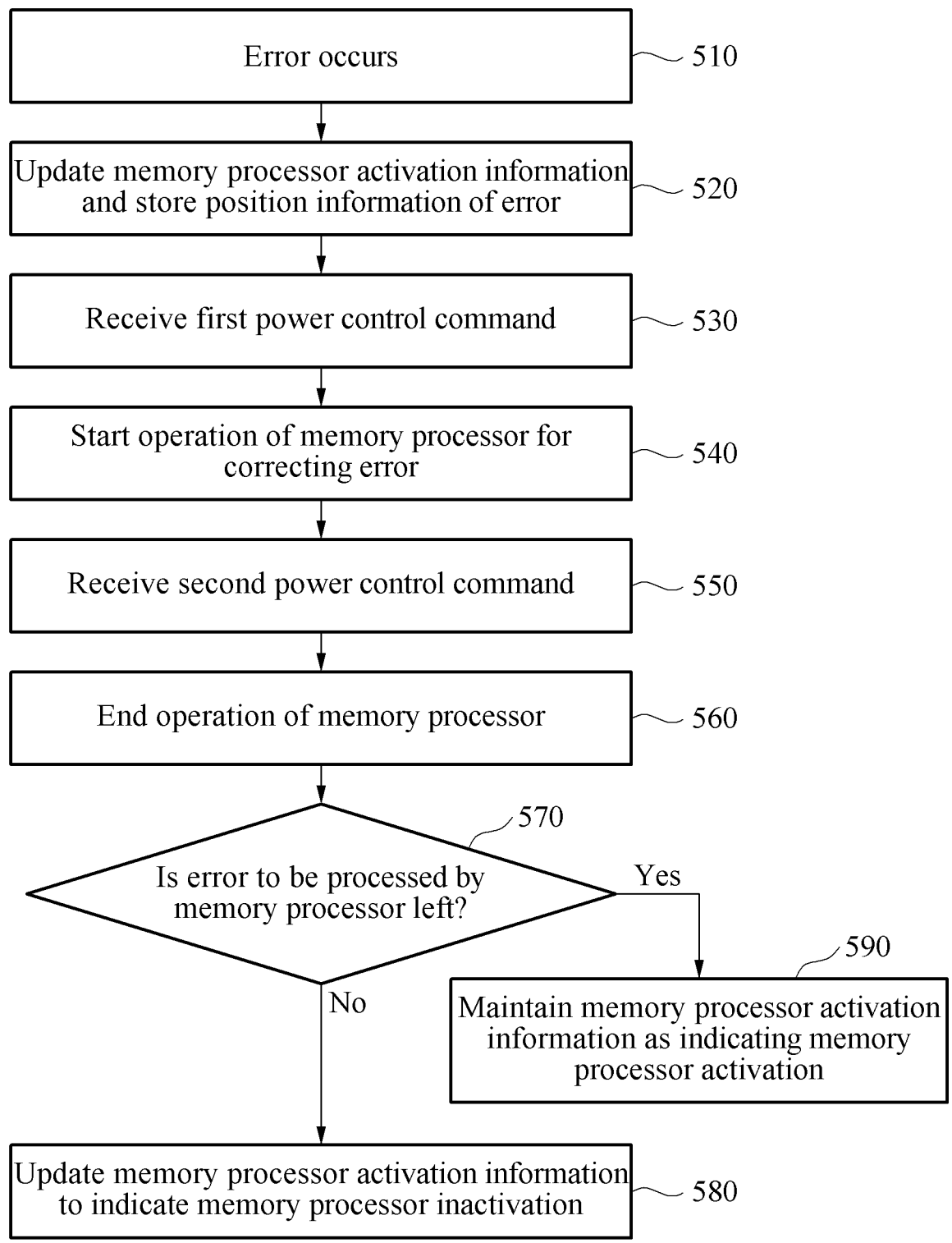
FIG. 5 illustrates an example of an operation of a memory device in response to an occurrence of an error, according to one or more embodiments.

FIG. 5 illustrates an example of an operation of a memory device in response to an occurrence of an error, according to one or more embodiments. In operation 510, an error may occur in the memory 190. In operation 520, the memory device 110 may update the memory processor activation information and store position information of the error. The memory device 110 may receive, from the error correction module 410, the memory processor activation information and the position information of the error.

In operation 530, the memory device 110 may receive a first power control command (e.g., 210). When the error occurs, the memory processor activation information may indicate 'memory processor activation' for the memory processor 170 to correct the error. Thus, the memory device 110 may receive the first power control command 210 and start an operation of the memory processor 170 for correcting the error. For example, the decoder 160 included in the memory device 110 may receive the first power control command 210 and transmit an error correcting operation start signal to the memory processor 170.

In operation 540, when receiving an operation-start signal (e.g., the error correcting operation start signal), the memory device 110 may start the operation of the memory processor 170 for correcting the error based on an address of the error (e.g., the error address 470).

In operation 550, the memory device 110 may receive a second power control command (e.g., 250). The memory device 110 may transmit an operation-end signal (e.g., an error correcting operation end signal) to the memory processor 170.

In operation 560, when receiving the second power control command 250, the memory device 110 may end the operation of the memory processor 170 for correcting the error.

In operation 570, the memory device 110 may determine whether there is another error is left to be corrected by the memory processor 170. In operation 590, when another error is still left to be corrected, the memory processor activation information may be maintained as indicating 'memory processor activation.' In operation 580, when no error is left to be corrected, the memory processor activation information may be updated to indicate 'memory processor inactivation.'

Figure 6:
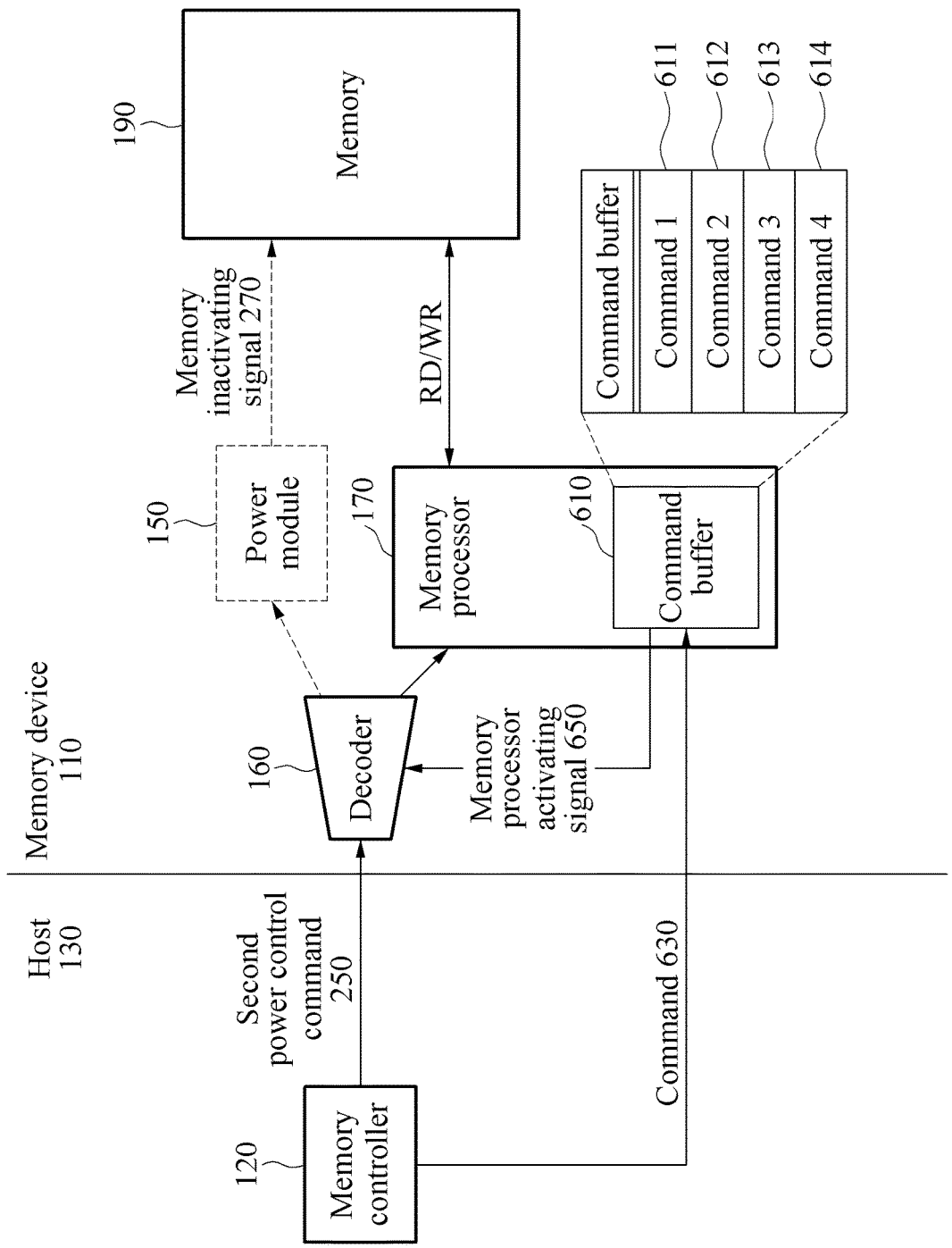
FIG. 6 illustrates an example of an operation of processing a command received from a host by a memory processor, according to one or more embodiments.

FIG. 6 illustrates an example of an operation of processing a command received from a host by a memory processor. The example memory device 110 shown in FIG. 6 may include the memory controller 120, a memory processor activating signal 650, the decoder 160, the memory processor 170, the power module 150, the memory 190, a command 630, a command buffer 610, and a plurality of commands 611, 612, 613, and 614.

In an example, the command buffer 610 may include a buffer configured to store commands. For example, the command buffer 610 may be included in the memory processor 170, the memory 190, or elsewhere (for example, in an area of memory where data is temporarily stored during transmission from one position to another).

The command 630 may include at least one command received by the memory device 110 from the host 130. The host 130 may transmit, to the memory processor 170, a command included in a task to thereby allow the memory processor 170 to process a portion of the task.

The memory processor 170 may execute commands included in the command buffer 610. For example, the command buffer 610 may include command 1 611, command 2 612, command 3 613, and/or command 4 614. In this example, the memory processor 170 may execute the commands in sequential order from command 1 611 through command 4 614.

In an example, the decoder 160 may receive a first power control command (e.g., 210) from the host 130. For example, there may be a case in which the host 130 will not be using the memory 190. In this example, the host 130 may transmit the first power control command 210 to the memory device 110. The transmitting of the first power control command 210 may indicate that the host 130 will not use the memory 190 for a period of time. Thus, during the time for which the host 130 does not use the memory 190, the memory processor 170 may execute commands present in the command buffer 610. The duration of time that the host 130 will not use the memory 190 may depend on the arbitrary internal operations of the host 130.

In an example, the decoder 160 may receive the memory processor activating signal 650 from the command buffer 610. When receiving the memory processor activating signal 650 and receiving the first power control command 210 (as the command 630), the decoder 160 may transmit an operation start signal to the memory processor 170. In this case, the memory processor 170 may sequentially execute commands present in the command buffer 610, and an executed command may be deleted from the command buffer 610. For example, when the memory processor 170 executes command 1 611, command 1 611 may be deleted from the command buffer 610, and other commands including command 2 612, command 3 613, and command 4 614 may be left in the command buffer 610.

In an example, the host 130 may transmit a second power control command (e.g., 250) to the memory device 110. For example, when the host 130 is to begin using the memory 190, the host 130 may transmit the second power control command 250 to the memory device 110. In this example, to prevent a conflict with the host 130, the decoder 160 may suspend an operation of the memory processor 170. The decoder 160 may thus receive the second power control command 250 and transmit an operation-end signal to the memory processor 170. When receiving the operation-end signal, the memory processor 170 may end the operation of the memory processor 170. When the operation of the memory processor 170 is ended, the memory device 110 may determine whether a command to be processed by the memory processor 170 is left in the command buffer 610. When a command is left in the command buffer 610, the memory device 110 may maintain the memory processor activation information as indicating 'memory processor activation.' For example, when the memory processor 170 executes only command 1 611 and ends the operation of the memory processor 170, the memory processor 170 may still need to process remaining commands, for example, command 2 612, command 3 613, and command 4 614 when receiving a next first power control command. However, when no command is left in the command buffer 610, the memory device 110 may update the memory processor activation information to indicate 'memory processor inactivation.' This is because there is no command left to be processed by the memory processor 170 and there is thus no need to activate the memory processor 170.

Figure 7:
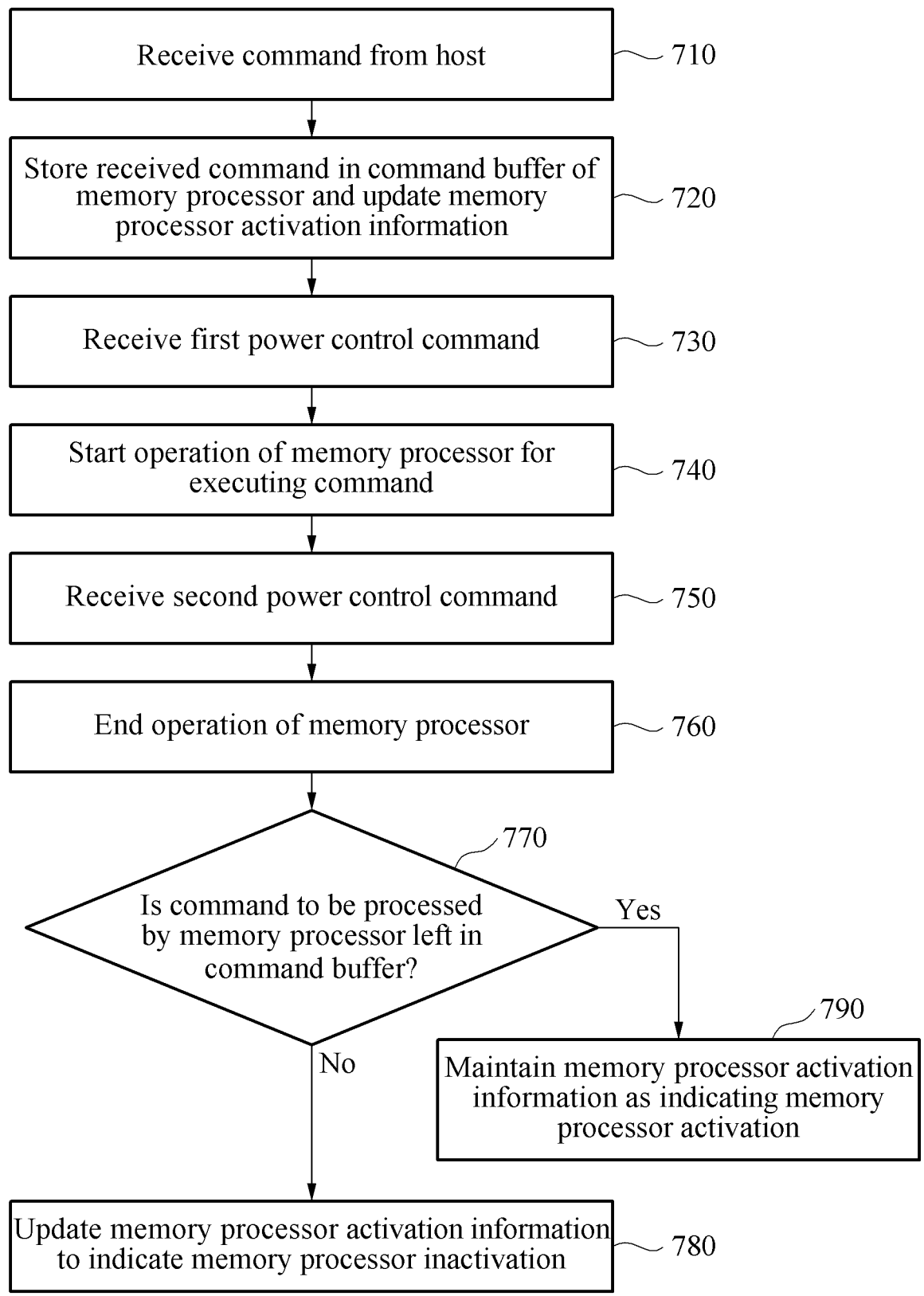
FIG. 7 illustrates an example of an operation of processing a command received from a host by a memory processor, according to one or more embodiments.

FIG. 7 illustrates an example of an operation of processing a command received from a host by a memory processor, according to one or more embodiments. In operation 710, the memory device 110 may receive a command from the host 130. In operation 720, the memory device 110 may store the received command in a command buffer of the memory processor 170 and update the memory processor activation information. Thus, the command buffer may include at least one command received from the host 130. When the command is received from the host 130, the memory device 110 may update or maintain the memory process activation information to indicate 'memory processor activation.'

In operation 730, the memory device 110 may receive a first power control command (e.g., 210). In this example, as noted, the memory processor activation information may have already been set to indicate 'memory processor activation' in order for the memory processor 170 to process the command received from the host 130 and stored in the buffer. Thus, the memory device 110 may receive the first power control command while the memory device 110 is allowing the memory processor 170 to execute the buffered command.

In operation 740, when receiving an operation-start signal (in relation to the first power control command), the memory processor 170 may start an operation of the memory processor 170 for executing the command included in the command buffer. While doing so, in operation 750, the memory device 110 may receive a second power control command (e.g., 250). Consequently, the memory device 110 may transmit an operation-end signal to the memory processor 170. In operation 760, when the second power control command is received, the memory device 110 may end the operation of the memory processor 170 for executing the command included in the command buffer. However, the executing the command in the command buffer may or may not be complete and the command may or may not remain in the command buffer. In operation 770, the memory device 110 may determine whether any command to be processed by the memory processor 170 remains in the command buffer. In operation 790, when the command (or any other command) remains in the command buffer, the memory processor activation information may be maintained as indicating 'memory processor activation.' In operation 780, when the command is not left in the command buffer, the memory processor activation information may be updated to indicate 'memory processor inactivation.' In either case, the processor 170 is stopped according to the operation-end signal.

Figure 8:
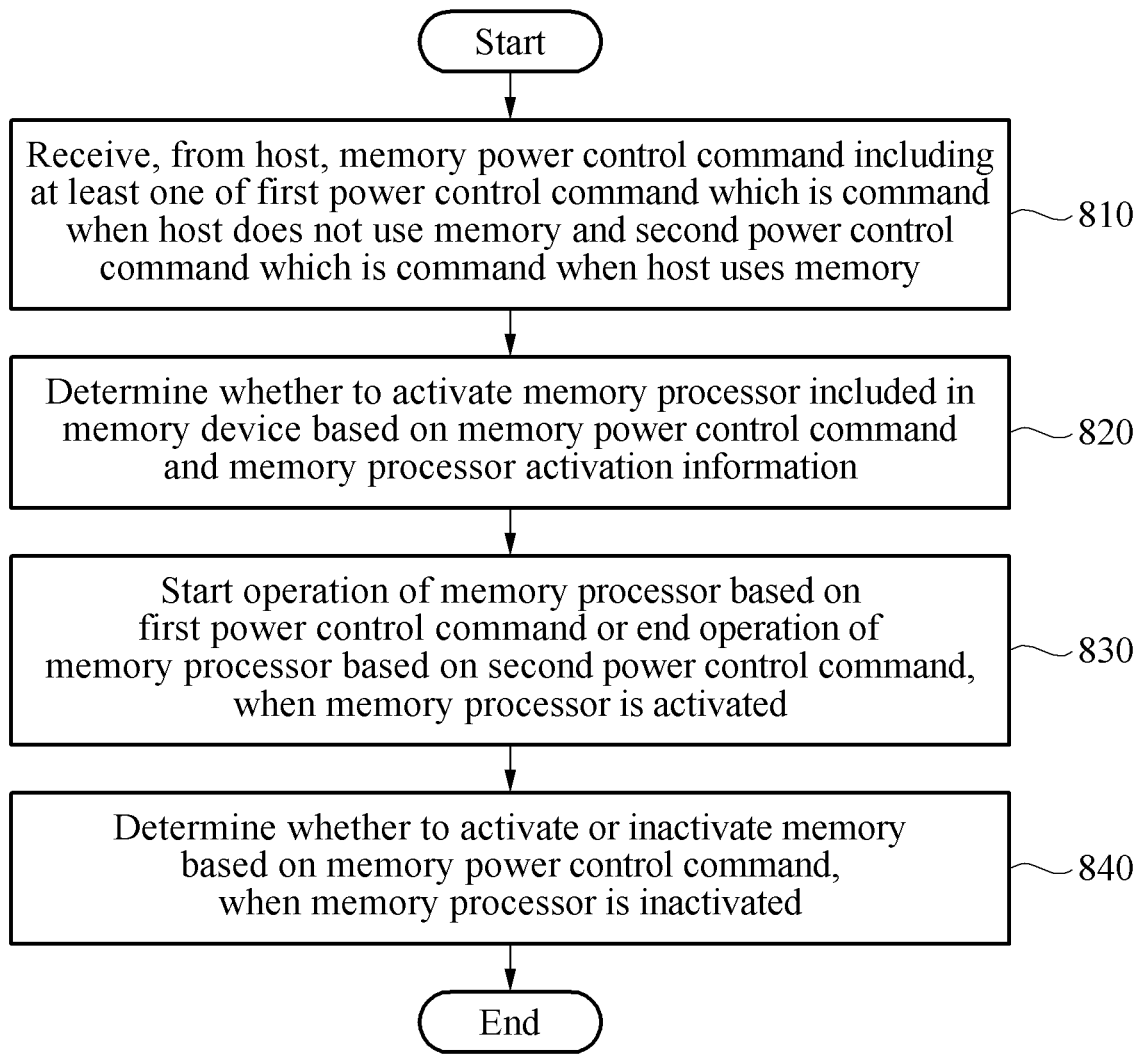
FIG. 8 illustrates an example of a method of controlling a memory processor, according to one or more embodiments.

FIG. 8 illustrates an example of a method of controlling a memory processor, according to one or more embodiments. In operation 810, the memory device 110 may receive a memory power control command from the host 130. The memory power control command may include either a first power control command (which is a command when the host 130 will not be using the memory 190) or a second power control command (which is a command when the host 130 be using the memory 190).

In operation 820, the memory device 110 may determine whether to activate the memory processor 170 included in the memory device 110 based on the memory power control command and memory processor activation information.

In operation 830, when the memory processor 170 is in an activated state, the memory device 110 may start an operation of the memory processor 170 based on the first power control command or end the operation of the memory processor 170 based on the second power control command.

In operation 840, when the memory processor 170 is in an inactivated state, the memory device 110 may determine whether to activate or inactivate the memory 190 based on the memory power control command.

In an example, the memory power control command may be a valid command for a memory device when it satisfies a condition. That is to say, a command applied by a host to the memory device may be valid or invalid. For example, a command received by the memory device from the host in a low chip clock enable (CKE) state may not be valid. Thus, the memory device may not operate based on the command. For another example, the command received from the host in a high CKE state may be valid for the memory device.

In an example, there may be a predetermined time for an operation to be performed without a conflict between a command of a memory processor and a command of a host. The predetermined time may be a time determined in advance based on memory specification information. The memory specification information may include information in which a command of the host is not accepted as valid for a predetermined period of time after a command is received by a memory device and a state of a memory is changed. In an example, the memory device may not accept (or execute) any commands from the host as valid for a predetermined period of time (e.g., tPD of a DRAM specification) after an entry into a power-saving state. In another example, the memory device may not accept any commands from the host as valid for a predetermined period of time (e.g., tXP of the DRAM specification) after an exit from the power-saving state. During a corresponding time (e.g., tPD+tXP), the memory may not receive any commands from the host, and thus the memory processor may freely use the memory.

In an example, during a self-refresh operation, the memory device 110 may use an internal clock without using a clock signal of the memory controller 120, and the memory controller 120 may not know an operating state of the memory device 110 performing the self-refresh operation. Thus, after the memory controller 120 applies an SRX command to the memory device 110, the memory controller 120 may wait for a maximum time that is used for an exit from a self-refresh state. After the wait for the maximum time, the memory controller 120 may need to give another valid command. The maximum time for the exit from the self-refresh state may be defined in a Joint Electron Device Engineering Council (JEDEC) standard. Referring to the JEDEC standard of an LPDDR2, the maximum time for the exit from the self-refresh state may be defined as a parameter that is a self-refresh exit to a next valid command delay after the exit from the self-refresh state, and may use a sign such as tXSR. Here, tXSR may be defined as tRFCab+10 nanoseconds (ns). tRFCab may be a sign of a parameter that is a refresh cycle time. In a case of the LPDDR2 of 64 megabytes (Mb), 128 Mb, 256 Mb, and 512 Mb, it may be 90 ns. In a case of the LPDDR2 of 1 giga-bytes (Gb), 2 Gb, and 4 Gb, it may be 130 ns. In a case of the LPDDR2 of 8 Gb, it may be 210 ns. In a case of a DDR3, 512 Mb may correspond to 90 ns, 1 Gb may correspond to 110 ns, 2 Gb may correspond to 160 ns, 4 Gb may correspond to 300 ns, and 8 Gb may correspond to 350 ns. That is, the memory controller 120 may not know the operating state of the memory device 110, and thus may give a next valid command after waiting for the time tXSR after applying the SRX command to the memory device 110. For another example, the memory controller 120 may give a next valid command after waiting for a time tCKSRE after applying an SRE command to the memory device 110.

Figure 9:
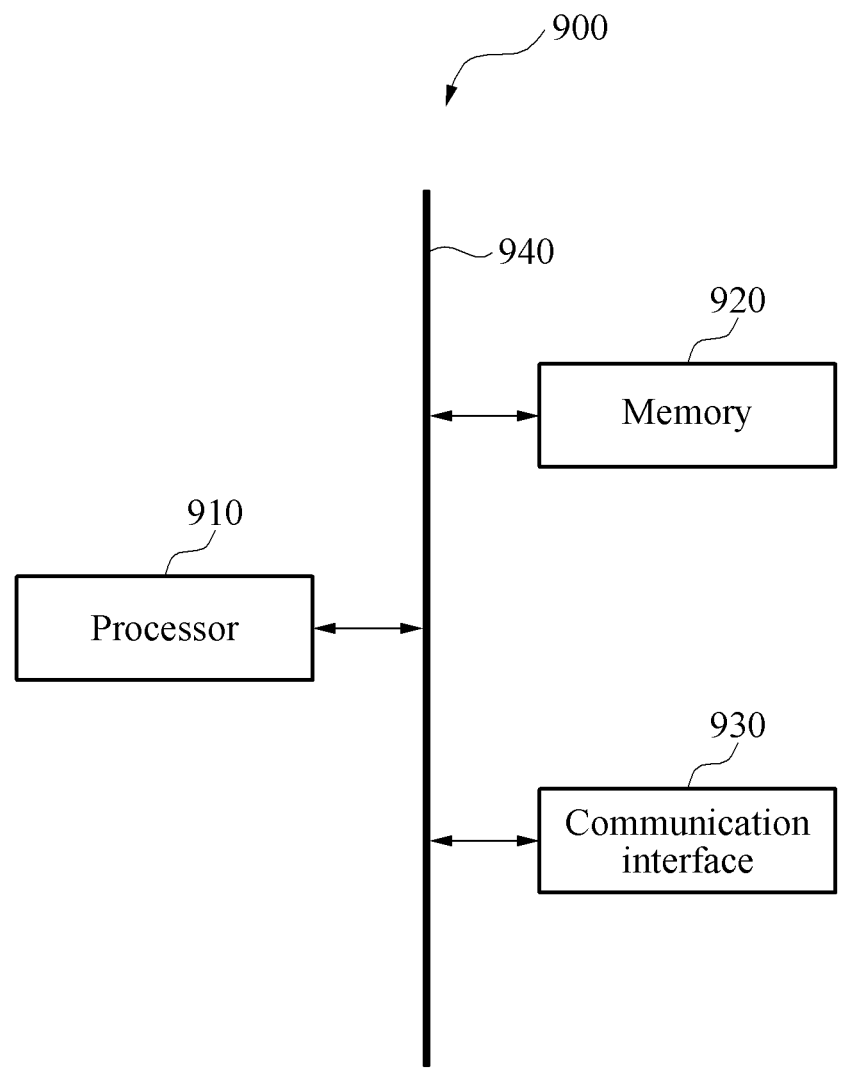
FIG. 9 illustrates an example of an electronic device, according to one or more embodiments.

FIG. 9 illustrates an example of an electronic device 900, according to one or more embodiments. Then electronic device 900 may include a memory 920, a processor 910, and a communication interface 930. The memory 920, the processor 910, and the communication interface 930 may be connected to one another through a communication bus 940. In some embodiments, the electronic device 900 may be any of the hosts described above. In some embodiments, the memory 920 is representative of host memory as well as any of the memory devices, and/or any one or more combinations of the non-limiting example components thereof, described above.

The memory 920 may store therein various sets of information generated during processing performed by the processor 910. The memory 920 may also store therein various sets of data and programs. The memory 920 may include a volatile memory or a nonvolatile memory. The memory 920 may include a massive storage medium such as a hard disk to store therein various sets of data. The memory 920 may be the same as or similar to the memory 190 of FIG. 1.

The processor 910 may be a hardware-implemented device having a physically structured circuit to execute desired operations. The desired operations may include, for example, codes or instructions (e.g., included in a program. The hardware-implemented device may include, for example, a microprocessor, a CPU, a GPU, a processor core, a multi-core processor, a multiprocessor, an application-specific integrated circuit (ASIC), a field-programmable gate array (FPGA), an NPU, or the like.

The processor 910 may execute instructions and control the electronic device 900. The instructions (e.g., code or a program) executed by the processor 910 may be stored in the memory 920.

The memory device, the electronic device, and other devices, apparatuses, units, modules, and components described herein with respect to FIGS. 1 and 9 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EE-PROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A method comprising:
   receiving, from a host, a memory power control command controlling power to a memory of a memory device, the memory power control command comprising either a first power control command or a second power control command, wherein the first power control command corresponds to the host not using a-the memory device, and wherein the second power control command corresponds to the host using the memory device;
   determining whether to activate a memory processor of the memory device based on the memory power control command and a memory processor activation information, where the memory processor activation information indicates whether to activate or inactivate the memory processor;
   wherein when the memory processor activation information indicates to activate the memory processor, determining whether starting an operation of the memory processor based on the first power control command or and whether ending the operation of the memory processor based on the second power control command; and
   wherein when the memory processor activation information indicates to inactivate the memory processor, determining whether to activate or inactivate the memory based on the memory power control command where the memory is inactivated in response to the first power control command and the memory is activated in response to the second power control command.

2. The method of claim 1, wherein the first power control command comprises at least one of:
   a power-saving start command for starting a power-saving state of the memory device; or
   a charging start command for starting a charging state of the memory device to maintain data comprised in the memory,
   wherein the second power control command comprises at least one of:
   a power-saving end command for ending a power-saving state; or
   a charging end command for ending a charging state.

3. The method of claim 2, wherein the charging state comprises at least one of:
   a first charging state for compensating for an electric charge quantity attenuated after a memory reading operation; or a second charging state for compensating for a leaked electric charge of a memory cell.

4. The method of claim 1, wherein the memory power control command comprises a command valid for the memory after a predetermined time elapses from a point in time of receiving the memory power control command.

5. The method of claim 4, wherein the predetermined time comprises a time available for an operation without a conflict between a command of the memory processor and a command of the host.

6. The method of claim 1, wherein, in response to an occurrence of an error, the memory processor activation information is updated to comprise information that activates the memory processor to correct the error.

7. The method of claim 6, wherein in response to the occurrence of the error, storing, by the memory processor, position information on a position at which the error occurs in the memory.

8. The method of claim 7, wherein the memory processor is configured to:
   correct the error based on the first power control command and the position information.

9. The method of claim 6, wherein, when the operation of the memory processor is ended based on the second power control command, the memory processor activation information is updated based on determining whether any error remains to be processed by the memory processor.

10. The method of claim 1, wherein the memory processor is configured to:
    execute at least one command in a command buffer, and wherein the command buffer comprises at least one command received from the host.

11. The method of claim 10, wherein, when the operation of the memory processor is ended based on the second power control command, the memory processor activation information is updated based on whether a command is determined to be present in the command buffer.

12. The method of claim 1, wherein the memory device further comprises a decoder, and wherein the determining whether to activate the memory processor is performed by the decoder, and where the inactivating of the memory processor is caused by the decoder.

13. The method of claim 1, further comprising the host generating the first power control command when the host determines to not use the memory device, and generating the second power control command when the host determines to use the memory device.

14. The method of claim 1, wherein the memory processor activation information includes an activation flag indicating the activation state of the memory processor, and the method comprises maintaining the activation flag indicating the activation state of the memory processor.

15. The method of claim 1, wherein the first memory power control command disallows the host to access the memory while allowing the memory processor to access the memory.

16. The method of claim 1, wherein the first power control command comprises a refresh command.

17. The method of claim 1, wherein, based on the memory processor activation information the memory processor is activated or inactivated, and, based on the memory power control command, the memory is activated or inactivated.

18. A non-transitory computer-readable storage medium storing instructions that, when executed by the memory device, cause the memory device to perform the method of claim 1.

19. A device comprising:
a memory device comprising a memory and a memory processor, the device configured to at least:
determine whether to activate the memory processor based on a received memory power control command controlling power to the memory, and memory processor activation information indicates whether to activate or inactive the memory processor, the memory power control command comprising at least one a first power control command corresponding to a host not using the memory or a second power control command corresponding to the host using the memory;
when the memory processor is activation information indicates to activate the memory processor, determine whether starting an operation of the memory processor based on the first power control command and whether ending the operation of the memory processor based on the second power control command; and
when the memory processor activation information indicates to inactivate the memory processor, determine whether to activate or inactivate the memory based on the memory power control command where the memory is inactivated in response to the first power control command and the memory is activated in response to the second power control command.

20. The device of claim 19, wherein the first power control command comprises at least one of:
a power-saving start command for starting a power-saving state of the memory device; or
a charging start command for starting a charging state to maintain data comprised in the memory device, and
wherein the second power control command comprises at least one of:

a power-saving end command for ending a power-saving state; or a charging end command for ending a charging state.

21. The device of claim 20, wherein the charging state comprises at least one of:
a first charging state for compensating for an electric charge quantity attenuated after a memory reading operation; or
a second charging state for compensating for a leaked electric charge quantity of a memory cell.

22. The device of claim 19, wherein the memory power control command is only treated by the memory device as valid for the memory after a predetermined time elapses from a point in time of the memory device receiving the memory power control command.

23. The device of claim 22, wherein the predetermined time comprises a time during which a command of the memory processor will not conflict with a command of the host.

24. The device of claim 19, wherein, in response to an occurrence of an error, the memory processor activation information is updated to information that activates the memory processor to correct the error.

25. The device of claim 24, wherein the memory processor is configured to:
in response to the occurrence of the error, store position information on a position at which the error occurs in the memory.

26. The device of claim 25, wherein the memory processor is configured to:
correct the error based on the first power control command and the position information.

27. The device of claim 26, wherein, when the operation of the memory processor is ended based on the second power control command, the memory processor activation information is updated based on whether any error remains to be processed by the memory processor.

28. The device of claim 19, wherein the memory processor is configured to:
execute at least one command in a command buffer configured to provide commands to the memory processor,
wherein the command buffer comprises at least one command received from the host.

29. The device of claim 28, wherein, when the operation of the memory processor is ended based on the second power control command, the memory processor activation information is updated based on whether a command is present in the command buffer.

30. The device of claim 19, wherein the device is an electronic device that further comprises the host comprising a host processor configured to provide the power control command to the memory device.

* * * * *